United States Patent [19]
Pirkle et al.

[11] Patent Number: 5,846,373
[45] Date of Patent: Dec. 8, 1998

[54] METHOD FOR MONITORING PROCESS ENDPOINTS IN A PLASMA CHAMBER AND A PROCESS MONITORING ARRANGEMENT IN A PLASMA CHAMBER

[75] Inventors: David R. Pirkle, Soquel; Randall S. Mundt, Pleasanton; William Harshbarger, San Jose, all of Calif.

[73] Assignee: Lam Research Corporation, Fremont, Calif.

[21] Appl. No.: 671,918

[22] Filed: Jun. 28, 1996

[51] Int. Cl.[6] ................................. C23J 1/08; C23J 1/00
[52] U.S. Cl. .............................................. 156/345; 216/84
[58] Field of Search ................................ 216/84; 156/345

[56] References Cited

U.S. PATENT DOCUMENTS

| | | |
|---|---|---|
| 4,602,981 | 7/1986 | Chen et al. . |
| 4,615,761 | 10/1986 | Tada et al. . |
| 4,675,072 | 6/1987 | Bennett et al. . |
| 4,846,920 | 7/1989 | Keller et al. . |
| 5,045,149 | 9/1991 | Nulty . |
| 5,322,590 | 6/1994 | Koshimizu ............................... 156/626 |
| 5,450,205 | 9/1995 | Sawin et al. . |
| 5,459,610 | 10/1995 | Bloom et al. ............................ 359/572 |
| 5,536,359 | 7/1996 | Kawada et al. ....................... 156/626.1 |
| 5,647,953 | 7/1997 | Williams et al. ..................... 156/643.1 |

*Primary Examiner*—Marian C. Knode
*Assistant Examiner*—Brenda G. Brumback
*Attorney, Agent, or Firm*—Burns, Doane, Swecker & Mathis, L.L.P.

[57] ABSTRACT

Thin film deposition process endpoints and in situ-clean process endpoints are monitored using a single light filter and photodetector arrangement. The light filter has a peak transmission proximate a characteristic wavelength of the deposition plasma, such as Si, and one of the plurality of reaction products, such as NO, in the plasma chamber during in-situ cleaning. Emissions passing through the filter are converted to voltage measurements by a photodetector. In deposition endpoint monitoring, emission intensity of the Si emissions reflected off the surface of the substrate oscillate as deposition thickness increases, with each oscillation corresponding to a definite increase in thickness of the film. The endpoint of the deposition is reached when the number of oscillations in signal intensity versus time corresponds to a desired film thickness. Alternatively, a deposition rate for the film is calculated from the oscillation frequency of emissions reflected off the substrate. Endpoint occurs when the integrated deposition rate corresponds to the desired film thickness. In in-situ clean endpoint monitoring, the endpoint of the process is reached when emission intensity of the particular reaction product decreases to a substantially steady state value, meaning that the reaction is complete.

18 Claims, 5 Drawing Sheets

METHOD FOR MONITORING PROCESS ENDPOINTS IN A PLASMA CHAMBER AND A PROCESS MONITORING ARRANGEMENT IN A PLASMA CHAMBER

FIELD OF THE INVENTION

The present invention relates to plasma chambers and, more particularly, to methods and arrangements for monitoring silicon dioxide deposition and in-situ clean process endpoints in plasma chambers.

BACKGROUND AND SUMMARY OF THE INVENTION

Deposition of silicon dioxide ($SiO_2$) is an important process for insulating between metal layers on integrated circuits or for processing devices such as flat panel displays. Determining the deposition rate is important to ensure that the $SiO_2$ film deposited is of the correct thickness. One technique for obtaining a particular film thickness involves placing a disposable sample in a plasma enhanced chemical vapor deposition (PECVD) reactor for a fixed period of time, subsequently measuring the film thickness, repeating the experiment for several different times to characterize the deposition rate for the reactor, and subsequently depositing $SiO_2$ on a substrate for a period of time corresponding to the period of time expected to achieve a desired film thickness on the substrate based on the previously determined deposition rate. More complicated techniques can also be used, such as ellipsometry.

It is also known to monitor etching process endpoints in plasma chambers by analyzing emissions of substances in the plasma chamber. Typically, as disclosed in, e.g., U.S. Pat. No. 4,615,761, this involves monitoring the quantity of radiation corresponding to a selected one of the plasma reaction products to ascertain when the reaction is finished. U.S. Pat. No. 5,045,149 discloses a method and apparatus for detecting the endpoint of a process of etching a first material over a second material. The optical emission intensity of the plasma etch process is simultaneously monitored by a positive filter and a negative filter generating first and second signals, respectively, the first and second signals being combined to yield a combined signal. The combined signal is monitored for a change indicative of the first material having been etched away and exposing the second material.

In addition to monitoring endpoints of plasma etching processes, it is desirable to monitor endpoints of plasma deposition processes. U.S. Pat. No. 5,450,205 discloses monitoring etching of a wafer or deposition of a thin film on a wafer by means of a charge coupled device (CCD) camera which views the wafer during plasma processing. Plasma emission or laser illumination reflected from the wafer exhibit temporal modulations caused by interferometry during etching or deposition of the wafer and are used to monitor etching or deposition process endpoints. It is desirable to accomplish the objective of monitoring endpoints of plasma deposition and in-situ clean processes with a less complex apparatus than is required by the arrangement disclosed in this patent.

PECVD reactors accumulate $SiO_2$ on their interior surfaces as they deposit $SiO_2$ onto integrated circuits. The $SiO_2$ must be periodically cleaned off the inside of the reactor before the accumulated $SiO_2$ interferes with the deposition process. One method of cleaning the reactor is to create a fluorine plasma from $NF_3$ to chemically react with the $SiO_2$, resulting in the following reaction:

$NF_3 + SiO_2 \rightarrow N_2 + NO + SiF_4 + F + $ other species

The fluorine plasma corrodes the reactor over time, and $NF_3$ gas is very expensive compared to most process gases. In addition, the value added by the deposition reactor is proportional to the rate at which wafers can be processed. Techniques used to determine when a cleaning process is complete include monitoring optical emissions from the plasma, monitoring the RF impedance on those reactors that are powered by RF, residual gas analysis, and monitoring of changes in bias voltage on RF powered electrodes.

Since it is desirable to end the in-situ clean process as soon as possible after all undesirable $SiO_2$ material has been removed from the inside of the reactor to avoid damage to the reactor, minimize expense, and reduce reactor downtime, it is desirable to monitor endpoints of in-situ clean processes. It is, moreover, desirable to monitor endpoints of plasma deposition processes and endpoints of in-situ clean processes in as economical a fashion as possible, and using as little extra equipment as possible.

According to one aspect of the present invention, a method of monitoring process endpoints in a plasma chamber is disclosed. According to the method, an $SiO_2$ deposition is performed on a semiconductor substrate. The $SiO_2$ deposition includes steps of generating a silicon and oxygen containing deposition plasma in a plasma chamber, filtering light emissions from the plasma chamber with a wavelength selective element, such as a light filter, a spectrometer, diffraction gratings, a prism, or the like, having a peak transmission proximate a characteristic wavelength of the deposition plasma, monitoring, with a photodetector, the intensity of light reflected from the wafer surface and transmitted through the wavelength selective element, and measuring voltage output from the photodetector. The voltage output oscillates at a frequency proportional to a rate of deposition of an $SiO_2$ layer on the substrate, and stopping generating the deposition plasma when a desired thickness of the $SiO_2$ layer is obtained. An in-situ clean process is also performed on the plasma chamber, subsequent to the $SiO_2$ deposition. The in-situ clean process includes steps of generating a fluorine containing etching plasma in the plasma chamber so that the etching plasma reacts with $SiO_2$ in the plasma chamber to form a plurality of reaction products, filtering light emissions from the plasma chamber with the wavelength selective element so that one of the reaction products having a characteristic wavelength proximate the peak transmission of the wavelength selective element is transmitted through the wavelength selective element, monitoring, with the photodetector, emission intensity of light emitted by the one of the reaction products, measuring voltage output from the photodetector, the voltage output being proportional to the amount of the reaction product in the etching plasma, and stopping generating the etching plasma when voltage measurements decrease to a substantially steady state value.

According to another aspect of the present invention, a method of monitoring process endpoints in a plasma chamber is disclosed. According to the method, a layer of a first material is deposited on a substrate by generating a first plasma in a plasma chamber, the plasma being of a material for forming the first material layer, filtering light emissions from the plasma chamber with a wavelength selective element, such as a light filter, a spectrometer, diffraction gratings, a prism, or the like, having a peak transmission proximate a characteristic wavelength of the first plasma, monitoring, with a photodetector, emission intensity of light emitted from the first plasma, reflected off the surface of the wafer, and transmitted through the wavelength selective element, measuring voltage output from the photodetector, the voltage output oscillating at a frequency proportional to a rate of deposition of the first material layer on the substrate and stopping generating the first plasma when a desired thickness of the first material layer is obtained. An in-situ clean process is performed on the plasma chamber, subsequent to the first material layer deposition, to remove first material layer deposits on the plasma chamber by generating a second plasma in the plasma chamber so that the second plasma reacts with the first material layer deposits on the plasma chamber to form a plurality of reaction products, filtering light emissions from the plasma chamber with the wavelength selective element so that one of the reaction products having a characteristic wavelength proximate the peak transmission of the wavelength selective element is transmitted through the wavelength selective element, monitoring, with the photodetector, emission intensity of light emitted by the one of the reaction products, measuring voltage output from the photodetector, the voltage output being proportional to the amount of the reaction product in the plasma, and stopping generating the second plasma when voltage measurements decrease to a substantially steady state value.

According to another aspect of the present invention, a process monitoring arrangement in a plasma chamber is disclosed. The process monitoring arrangement includes a plasma chamber having a wall, the plasma chamber including means for generating, during an $SiO_2$ deposition process, a silicon and oxygen containing deposition plasma and, during an in-situ clean process, a fluorine containing etching plasma in the plasma chamber so that the etching plasma reacts with $SiO_2$ in the plasma chamber to form a plurality of reaction products. The arrangement further includes a transmissive window or light pipe mounted in the wall of the plasma chamber permitting a view of the wafer, either directly or in some other manner, such as with a mirror. A wavelength selective element, such as a light filter, a spectrometer, diffraction gratings, prisms, or the like, the wavelength selective element having a peak transmission peak transmission proximate a characteristic wavelength of the deposition plasma and one of the plurality of reaction products views the wafer through the window or light pipe. A photodetector is provided for monitoring emission intensity of light emitted by the deposition plasma and reflected off the wafer during the $SiO_2$ deposition process and the one of the reaction products during the in-situ clean process. Means are provided for measuring voltage output from the photodetector to determine endpoints of the $SiO_2$ deposition process and the in-situ clean process.

According to yet another aspect of the present invention, a process monitoring arrangement in a plasma chamber is provided. The process monitoring arrangement includes a plasma chamber having a wall, the plasma chamber including plasma generating equipment for generating, during a deposition process, a first plasma for generating a first material layer and, during an in-situ clean process, a second plasma, the second plasma reacting with first material layer deposits in the plasma chamber to form a plurality of reaction products. The process monitoring arrangement includes a wavelength selective element, such as a light filter, a spectrometer, diffraction gratings, prisms, or the like, mounted in the wall of the plasma chamber permitting a view of the wafer, either directly or with other suitable equipment, such as with a mirror. The wavelength selective element has a peak transmission proximate both a characteristic wavelength of the first plasma and one of the plurality of reaction products views the wafer through the window or light pipe. The process monitoring arrangement includes a photodetector for monitoring emission intensity of light emitted by the first plasma during the deposition of the first material layer and the one of the reaction products during the in-situ clean process. Means are provided for monitoring voltage output from the photodetector to determine endpoints of the first material layer deposition process and the in-situ clean process.

BRIEF DESCRIPTION OF THE DRAWINGS

The features and advantages of the present invention are well understood by reading the following detailed description in conjunction with the drawings in which like numerals indicate similar elements and in which.

DETAILED DESCRIPTION OF THE PREFERRED EMBODIMENTS

A substrate such as a semiconductor wafer, flat panel display substrate, etc., to be processed according to the present invention is mounted within the chamber by a suitable mounting apparatus such as a mechanical or electrostatic clamp (ESC). In the case of an electrostatic clamp, the electrostatic clamp can include water cooling channels for substrate temperature control.

Figure 1A:
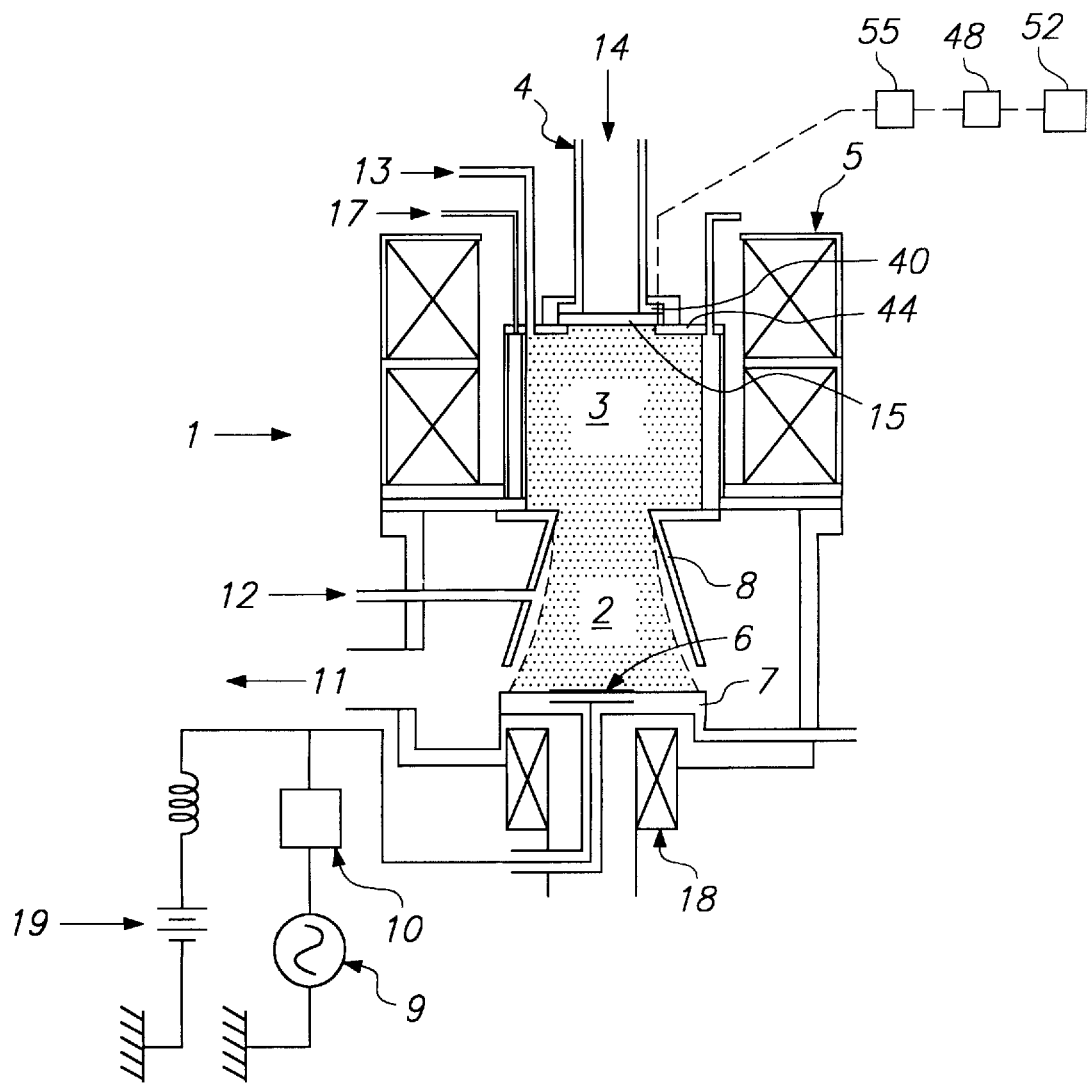
FIG. 1a is a schematic view of a high density plasma ECR reactor which can be used to carry out the process according to the invention.

FIG. 1a shows an electro-cyclotron ("ECR") reactor 1 which can process a substrate with a high density plasma. The reactor includes a reaction chamber 2 wherein a substrate is subjected to treatment with a plasma gas. In order to generate the high density plasma, the reactor includes a plasma generating chamber 3 wherein a high density plasma is generated by the combination of microwave energy transmitted through microwave guide 4 and magnetic energy generated by electromagnetic coils 5. The high density plasma can be generated from a suitable gas or gas mixture such as oxygen and/or argon. A substrate 6 is supported on a substrate support 7 such as an electrostatic chuck.

The high density plasma generated in chamber 3 can be confined within horn 8 and directed to the substrate 6 by applying an RF bias to the substrate by means of an RF source 9 and associated circuitry 10 for impedance matching, etc. The reaction chamber 2 is evacuated by a suitable vacuum arrangement represented generally by the evacuation port 11. In order to introduce one or more reactants into the high density plasma, the horn 8 can include one or more gas injection arrangements such as gas distributing rings on the inner periphery thereof whereby reactants such as SiH$_4$ and SiF$_4$ can be introduced into the high density plasma. The reactant or reactants can be supplied through one or more passages represented generally at 12. In order to produce a plasma in plasma generating chamber 3, oxygen and argon can be introduced into the plasma generating chamber 3 by one or more passages represented generally at 13.

Microwave energy represented by arrow 14 travels through dielectric window 15 and enters the plasma generating chamber 3, the walls of which are water cooled by water supply conduit 17. Electromagnetic coils 18 below substrate holder 7 are used for shaping the magnetic field in the vicinity of the substrate 6. A DC power source 19 provides power to the substrate holder 7 for electrostatically clamping substrate 6.

Figure 1B:
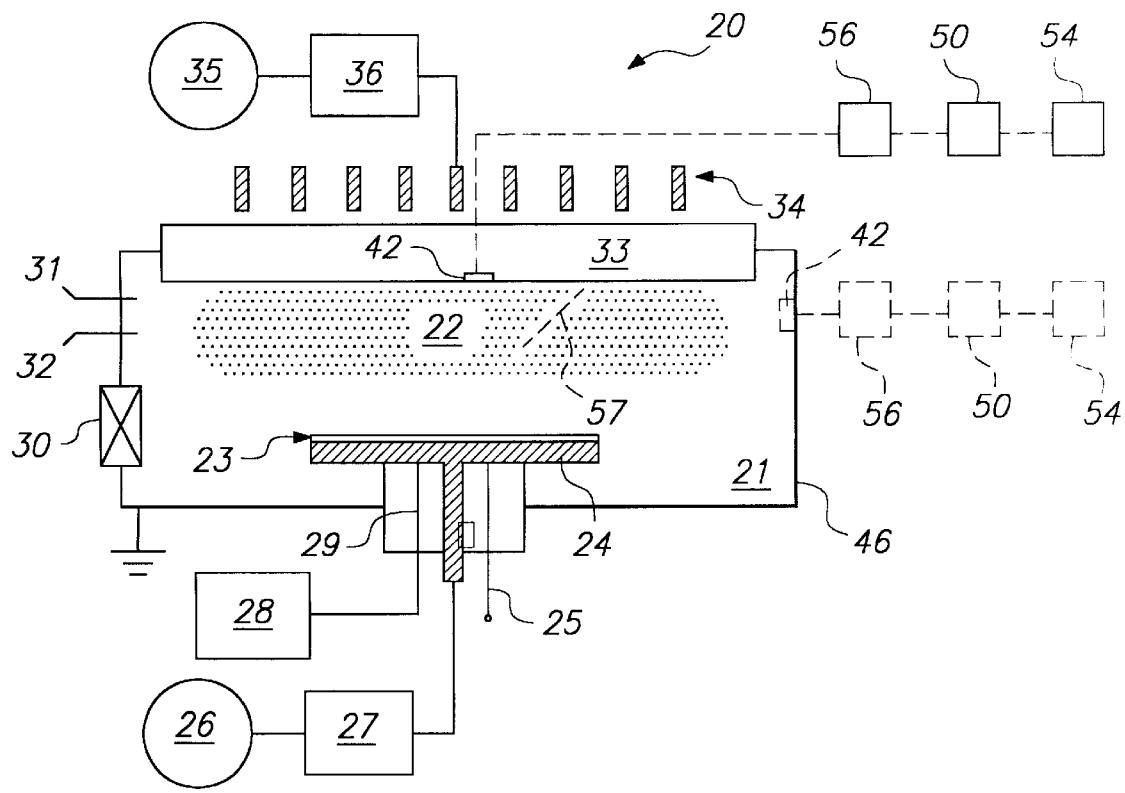
FIG. 1b is a schematic of a high density plasma TCP reactor which can be used to carry out the process according to the invention.

FIG. 1b shows a transformer coupled/inductively coupled ("TCP") reactor 20 which can process substrates with high density plasma. The reactor includes a process chamber 21 in which plasma 22 is generated adjacent substrate 23. The substrate is supported on water cooled substrate support 24 and temperature control of the substrate is achieved by supplying helium gas through conduit 25 to a space between the substrate and the substrate support. The substrate support can comprise an aluminum electrode or a ceramic material having a buried electrode therein, the electrode being powered by an RF source 26 and associated circuitry 27 for providing RF matching, etc. The temperature of the substrate during processing thereof is monitored by temperature monitoring equipment 28 attached to temperature probe 29.

In order to provide a vacuum in chamber 21, a turbo pump is connected to outlet port 30 and a pressure control valve can be used to maintain the desired vacuum pressure. Reactants such as an oxygen-containing reactant (e.g., oxygen) and a silicon-containing reactant (e.g., silane) can be supplied into the chamber by conduits 31, 32 which feed the reactant gases to a gas distribution ring extending around the underside of dielectric window 33 or the reactants can be supplied through a dielectric showerhead window. A TCP coil (i.e., RF antenna) 34 located outside the chamber in the vicinity of the window is supplied RF power by RF source 35 and associated circuitry 36 for impedance matching, etc. When a substrate is processed in the chamber, the RF source 35 can supply the TCP coil 34 with RF current such as at 13.56 MHz and the RF source 26 can supply the lower electrode with RF current such as at 400 kHz.

The PECVD chamber according to the embodiments of the present invention shown in FIGS. 1a and 1b or other chamber designs such as other inductively coupled or transformer coupled plasma reactors, radio frequency inductive ("RFI"), parallel plate or helicon reactors, etc., includes suitable process gas arrangements for depositing a layer such as a silicon dioxide layer on a substrate and after the substrate is removed from the chamber, the chamber can be cleaned with a suitable etching gas chemistry. During the in-situ clean process after processing and removal of the substrate, an etching gas such as a fluorine containing etching gas reacts with the deposited layer (e.g., doped or undoped SiO$_2$) in the plasma chamber to form a plasma including the following reaction products in the case of etching a SiO$_2$ layer with fluorine:

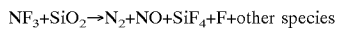

NF$_3$+SiO$_2$→N$_2$+NO+SiF$_4$+F+other species

A window or light pipe 40,42 mounted in the wall 44,46 of the plasma chamber 3,21 is used for monitoring the deposition and cleaning process. The wafer is viewed with a suitable wavelength selective element such as a light filter, a spectrometer, diffraction gratings, or a prism. According to a preferred embodiment, the wavelength selective device is a light filter 55,56, preferably an interference-type filter and preferably having a peak transmission proximate a characteristic wavelength of Si (e.g., 250 nm) and one of the plurality of reaction products, preferably NO (e.g., 236, 247 or 259 nm). The wavelength selective device preferably views the wafer directly through the window or light pipe 40,42, as seen in FIGS. 1a and 1b, or as shown by dotted lines in FIG. 1b, indirectly by some suitable technique, such as reflection off of a mirror 57. For convenience of discussion, the term "light filter" is used hereinafter, except where otherwise noted, although it is understood that any of the other suitable wavelength selective elements may be used.

Figure 2:
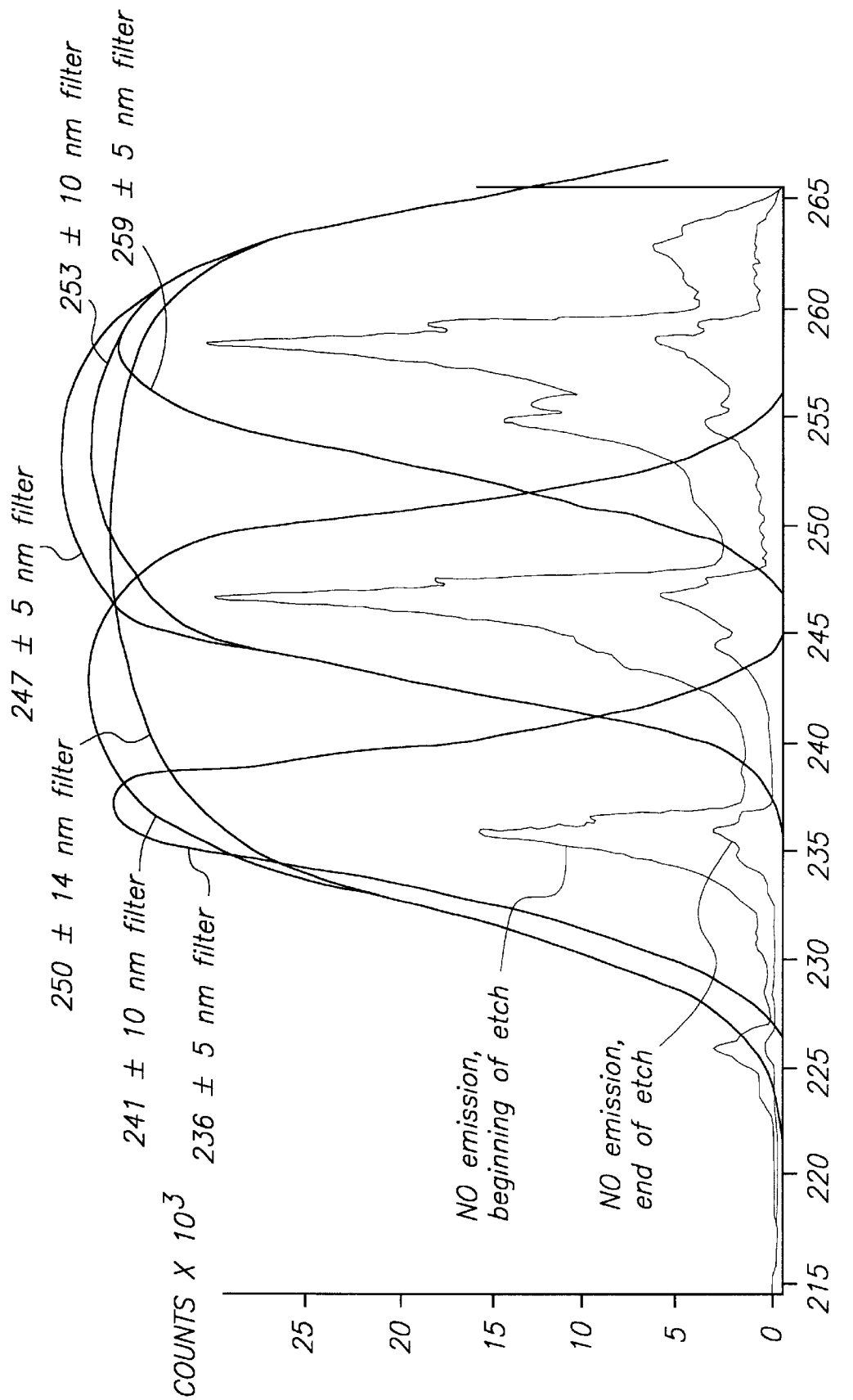
FIG. 2 is a graph showing the emission spectrum for NO at the beginning and at the end of an in-situ clean process superimposed over graphs of suitable UV filter bandpasses for detecting NO emissions.

The peak transmission of the light filter 55,56 is preferably approximately 250 nm. A particularly preferred light filter has a full-width transmission of 28 nm, i.e., it strongly attenuates wavelengths less than 236 nm and greater than 264 nm. As seen in the emission spectrum for NO shown in FIG. 2, NO reaction products developed during an in-situ clean process emit strong lines at wavelengths at 236, 247, and 259 nm. FIG. 2 shows the emission spectrum for NO at the beginning and at the end of etching or cleaning superimposed over graphs of several suitable UV filter bandpasses for detecting NO emissions. NO emissions at the above-noted wavelengths are transmitted through the preferred light filter. The filter may, for example, have a maximum transmission at 236, 247, or 259 nm, with a bandpass of ±5 nm, such that a single emission line is detected, a maximum transmission at 241 or 253 nm with a bandpass of ±10 nm, such that two emission lines are detected, or, as in the preferred embodiment, peak transmission at 250 nm with a bandpass of ±14 nm, such that three NO emission lines are detected.

Figure 3:
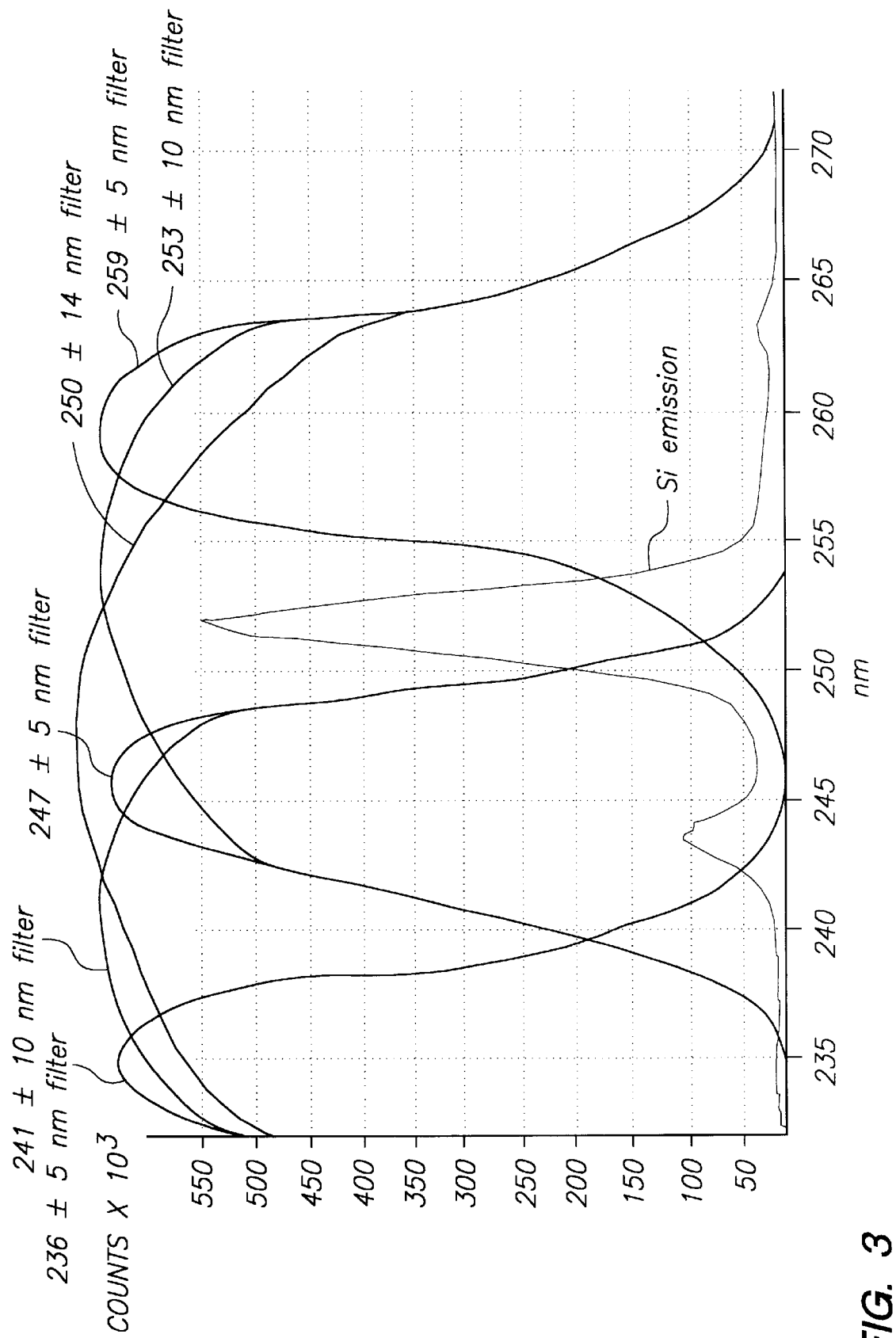
FIG. 3 is a graph showing the emission spectrum for Si superimposed over a graph of a suitable UV filter bandpass for detecting Si and NO emissions.

FIG. 3 shows the emission spectrum of Si superimposed over the graphs of filters discussed above with reference to FIG. 2, for detecting Si and/or NO emissions. The preferred light filter for use in connection with the present invention transmits the approximately 250 nm wavelength Si emissions, as well as one or more NO emission lines.

As seen in FIGS. 1a and 1b, a photodetector 48,50 is provided for monitoring emission intensity of light emitted by the deposition plasma during the SiO$_2$ deposition process and the one of the reaction products during the in-situ clean process. The photodetector 48,50 converts the light intensity into an electrical voltage that is amplified and delivered to external terminals for monitoring. Voltage output from the photodetector 48,50 is monitored, such as by a computer 52,54 programmed with a suitable known algorithm, to determine endpoints of the SiO$_2$ deposition process and the in-situ clean process.

Figure 4:
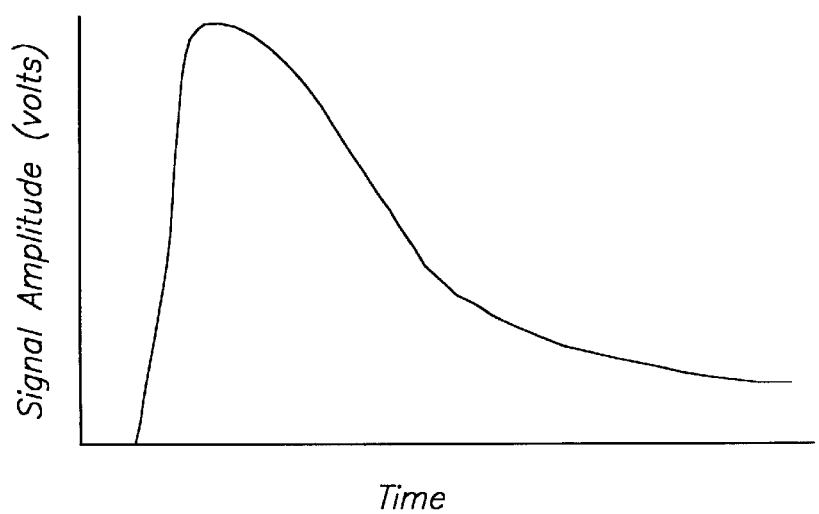
FIG. 4 is a graph showing the general shape of voltage versus time (without units) for detected emissions of NO during an in-situ clean process in a plasma chamber.

FIG. 4 is a graph of voltage measurements during an in-situ clean process, showing that emission intensity of NO peaks early in the process, and then decreases monotonically to a steady state value. As the SiO$_2$ in the plasma chamber is etched away, the amount of oxygen available for forming NO diminishes and the endpoint signal diminishes proportionally. When the SiO$_2$ is etched away completely, a steady voltage signal is output, although the detector output does not go to zero because some etching, such as of an oxygen containing surface (e.g., a quartz liner in the chamber), takes place as a background. The in-situ clean process is complete when the slope of the NO emission becomes less than a predetermined value dependent upon factors such as the plasma emission intensity and the endpoint detector gain. A preferred endpoint slope of NO emissions for determining endpoints of in-situ clean processes is less than 0.25% of maximum signal per second. For example, for a 2 volt peak signal, a preferred endpoint slope is less than 0.005 volts/second.

Figure 5:
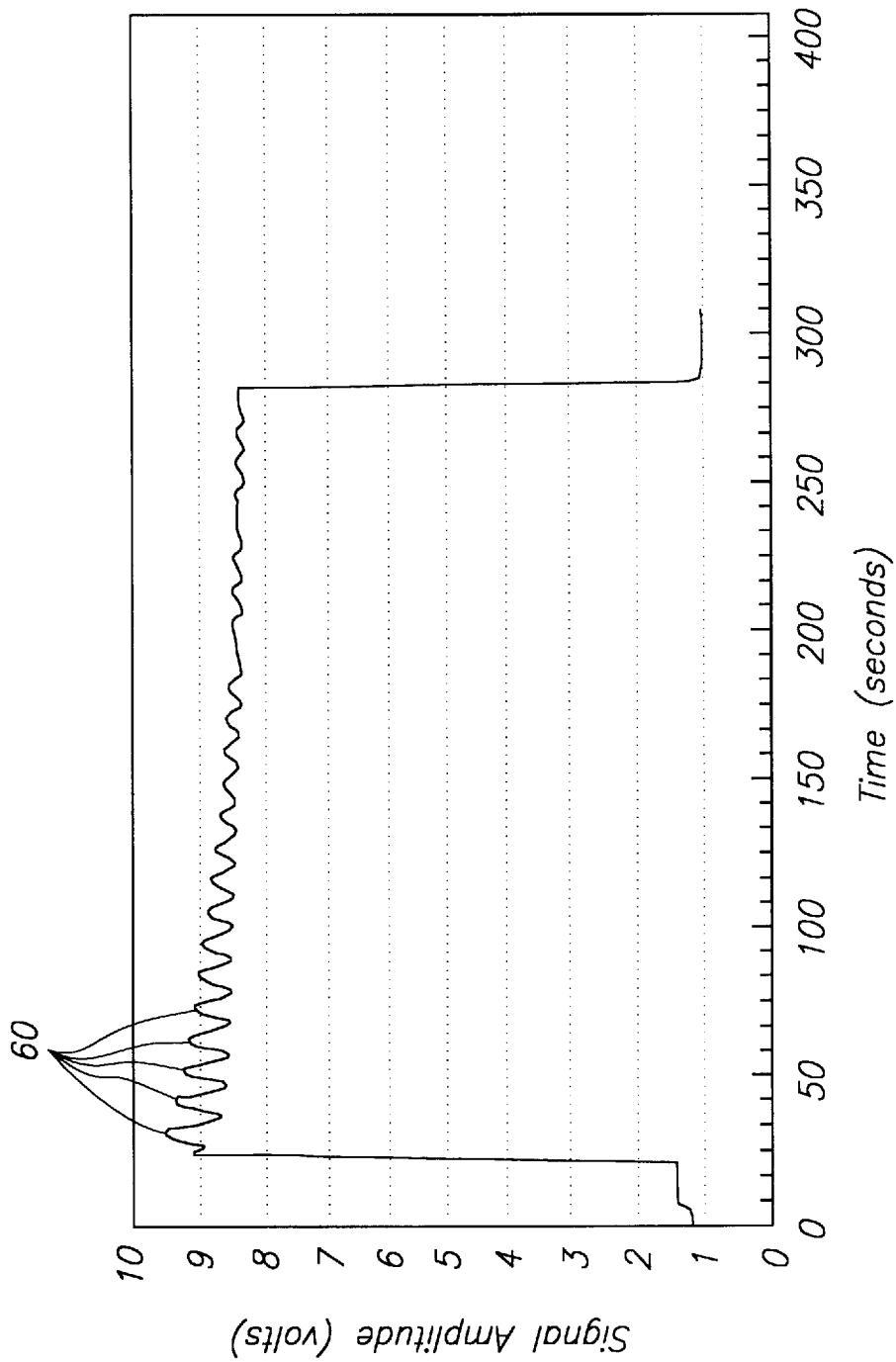
FIG. 5 is a graph showing the general shape of voltage versus time for detected emissions of Si during a PECVD process in a plasma chamber.

FIG. 5 is a graph of voltage measurements during a deposition process. The emission intensity of the Si oscillates as the deposition thickness increases. Each amplitude oscillation corresponds to an increase in the thickness of the deposited film according to the following relationship:

$$dt = L \frac{\sqrt{n^2 - \sin^2 a}}{2n^2} = L\cos b/2n$$

where:
dt=change in thickness;
L=wavelength of light emission (e.g., 250 nm);
n=refractive index of the deposited film;
a=angle of wave-vector relative to a perpendicular to the substrate. This is defined as the angle of view;
b=angle of wave-vector relative to a perpendicular to the substrate, inside the film, after it has been refracted;
sina=nsinb.

By determining the oscillation frequency of the output signal, the deposition rate can be determined. A total thickness can be calculated from the integrated deposition rate and the process stopped at the desired thickness. Also, by counting the number of fringes 60 in a graph such as that shown in FIG. 5, the thickness of the deposited film can be determined, and the process may be stopped when the desired thickness is achieved.

It is desirable to monitor in-situ clean and $SiO_2$ deposition processes using emissions having short wavelengths, preferably on the order of 250 nm because such wavelengths produce good signal-to-noise ratios for detecting both the in-situ clean and thin film deposition endpoints. The continuum radiation amplitude at this wavelength is low. The short wavelength minimizes signal-to-noise degradation due to coatings deposited on the observation optics. The short wavelength also results in high resolution for measuring the deposited film thickness in the deposition application. The short wavelength minimizes interference with the signal-to-noise ratio due to patterning on the substrate. Detecting a short wavelength produces a useful signal for deposition endpoint detection even on substrates with a high density of patterning with small feature sizes for film thicknesses up to 2 microns.

If desired or necessary, the process monitoring arrangement can be used to detect in-situ clean endpoints and not deposition endpoints, and vice versa, by monitoring emission spectra of NO or Si at wavelengths other than proximate 250 nm. For example, the arrangement performs satisfactorily as an in-situ clean endpoint detector with an interference filter that passes any one or combination of NO emission lines, such as is seen in FIG. 2.

Similarly, the arrangement can be used to detect deposition endpoints based on emissions of Si by using an interference filter that passes any of the strong emission lines from the deposition process. For example, strong lines occur at 250, 280, 309, 486, 610, 724, and 750 nm. However, at 486 nm and above, sensitivity of the detector 48, 50 to patterning on a substrate tends to increase and degrade the results. Also, the 309 nm emission is fairly broad and may yield inaccurate results. It is presently believed that a filter 55,56 having a peak transmission proximate 250 nm is best for performing both deposition endpoint detection and in-situ clean endpoint detection.

If desired or necessary, process endpoints other than those involving $SiO_2$ deposition and in-situ plasma chamber cleaning can be determined, such as where plasmas other than silicon containing plasmas are generated for deposition and the plasma chamber must subsequently be cleaned of deposits by appropriate selection of etching gases. Other silicon containing films that may benefit from the present invention include polysilicon, poly-Si, and silicon nitride, $Si_3N_4$. A wavelength selective device such as a filter having a peak transmission proximate strong emission lines for a component of the plasma generated during deposition and for a reaction product of the in-situ clean process may be used for endpoint detection. In in-situ clean process endpoint monitoring for cleaning with $NF_3$ gas, it is also possible to monitor emission lines of reaction products other than NO, such as F. Where emission lines of reaction products from the in-situ clean process are at wavelengths proximate wavelengths of Si, in-situ clean endpoint and deposition endpoint monitoring can be performed with the same equipment through choice of a filter having peak transmission over an appropriate bandwidth.

While this invention has been illustrated and described in accordance with a preferred embodiment, it is recognized that variations and changes may be made therein without departing from the invention as set forth in the claims.

What is claimed is:

1. A process monitoring arrangement in a plasma chamber for deposition of silicon dioxide on a semiconductor substrate, comprising:
   a plasma chamber having a wall and at least one inlet supplying silicon and oxygen reactants, the plasma chamber including plasma generating equipment for generating, during an $SiO_2$ deposition process, a silicon and oxygen containing deposition plasma;
   a window mounted in the wall of the plasma chamber;
   a wavelength selective element in optical communication with the window, the wavelength selective element having a peak transmission proximate a characteristic wavelength of the deposition plasma;
   a photodetector for monitoring emission intensity of light emitted by the deposition plasma during the $SiO_2$ deposition process, the light being reflected off the semiconductor substrate and passed through the wavelength selective element prior to being received by the photodetector; and
   a computer monitoring voltage output from the photodetector to determine endpoints of the $SiO_2$ deposition process.

2. The process monitoring arrangement as set forth in claim 1, wherein the wavelength selective element includes a light filter.

3. The process monitoring arrangement as set forth in claim 2, wherein the light filter includes an interference filter and peak transmission of the wavelength selective element is in a range of 236 to 264 nm.

4. The process monitoring arrangement as set forth in claim 1, wherein the wavelength selective element includes a spectrometer.

5. The process monitoring arrangement as set forth in claim 1, wherein the wavelength selective element includes diffraction gratings.

6. The process monitoring arrangement as set forth in claim 1, wherein the wavelength selective element includes a prism.

7. The process monitoring arrangement as set forth in claim 1, wherein the wavelength selective element comprises an interference filter and the computer determines the thickness of the SiO$_2$ layer by counting a number of oscillations in emission intensity of Si reflected off the semiconductor substrate.

8. The process monitoring arrangement as set forth in claim 1, wherein the wavelength selective element comprises an interference filter, the computer determines the thickness of a silicon dioxide layer deposited on the semiconductor substrate by determining a deposition rate of the deposited silicon dioxide layer as a function of the voltage oscillation frequency of the plasma emission reflected off the semiconductor substrate, and the computer calculates an accumulated thickness of the silicon dioxide layer as a function of the deposition rate.

9. The process monitoring arrangement as set forth in claim 1, wherein the plasma chamber includes a supply of fluorine for an in-situ chamber cleaning process in which a fluorine containing etching plasma reacts with silicon dioxide in the plasma chamber and forms a plurality of reaction products, the peak transmission of the wavelength selective element is proximate a characteristic wavelength of the deposition plasma and one of the plurality of reaction products, the photodetector monitors emission intensity of one of the reaction products during an in-situ chamber cleaning process, and the computer monitors voltage output from the photodetector and determines endpoints of the in-situ chamber cleaning process.

10. The process monitoring arrangement as set forth in claim 9, wherein the at least one of the reaction products is NO.

11. A process monitoring arrangement in a plasma chamber, comprising:

a plasma chamber having a wall, the plasma chamber including plasma generating equipment for generating, during a deposition process, a first plasma for generating a first material layer and, during an in-situ clean process, a second plasma, the second plasma reacting with first material layer deposits in the plasma chamber to form a plurality of reaction products;

a window mounted in the wall of the plasma chamber;

a wavelength selective device in optical communication with the window, the wavelength selective device having a peak transmission proximate both a characteristic wavelength of the first plasma and one of the plurality of reaction products;

a photodetector for monitoring emission intensity of light emitted by the first plasma during the deposition of the first material layer on a semiconductor substrate and the one of the reaction products during the in-situ clean process; and a computer monitoring voltage output from the photodetector to determine endpoints of the first material layer deposition process and the in-situ clean process.

12. The process monitoring arrangement as set forth in claim 11, wherein the wavelength selective element includes a light filter.

13. The process monitoring arrangement as set forth in claim 12, wherein the light filter includes an interference filter and peak transmission of the wavelength selective element is in a range of 236 to 264 nm.

14. The process monitoring arrangement as set forth in claim 11, wherein the wavelength selective element includes a spectrometer.

15. The process monitoring arrangement as set forth in claim 11, wherein the wavelength selective element includes diffraction gratings.

16. The process monitoring arrangement as set forth in claim 11, wherein the wavelength selective element includes a prism.

17. The process monitoring arrangement as set forth in claim 11, wherein the wavelength selective element comprises an interference filter and the computer determines the thickness of the SiO$_2$ layer by counting a number of oscillations in emission intensity of Si reflected off the semiconductor substrate.

18. The process monitoring arrangement as set forth in claim 11, wherein the wavelength selective element comprises an interference filter, the computer determines the thickness of a silicon dioxide layer deposited on the semiconductor substrate by determining a deposition rate of the deposited silicon dioxide as a function of the voltage oscillation frequency of the plasma emission reflected off the semiconductor substrate, and the computer calculates an accumulated thickness as a function of the deposition rate.

* * * * *